(12) United States Patent
Ahsan et al.

(10) Patent No.: US 11,152,352 B2
(45) Date of Patent: Oct. 19, 2021

(54) DUAL MODE SNAP BACK CIRCUIT DEVICE

(71) Applicant: Intel Corporation, Santa Clara, CA (US)

(72) Inventors: Akm Ahsan, Portland, OR (US); Mark Armstrong, Portland, OR (US); Guannan Liu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/368,671

(22) Filed: Mar. 28, 2019

(65) Prior Publication Data
US 2020/0312838 A1    Oct. 1, 2020

(51) Int. Cl.
| | | |
|---|---|---|
| *H01L 27/02* | (2006.01) | |
| *H01L 21/8249* | (2006.01) | |
| *H01L 27/06* | (2006.01) | |

(52) U.S. Cl.
CPC ...... *H01L 27/0274* (2013.01); *H01L 21/8249* (2013.01); *H01L 27/0623* (2013.01)

(58) Field of Classification Search
None
See application file for complete search history.

(56) References Cited

U.S. PATENT DOCUMENTS

2003/0052332 A1* 3/2003 Chen ............... H01L 27/0262
    257/173
2011/0254120 A1  10/2011 Imahashi
2011/0298051 A1  12/2011 Khieu et al.
2019/0035777 A1*  1/2019 Ohtake .......... H01L 21/823475
2019/0051646 A1*  2/2019 Salcedo ............. H01L 27/0288

FOREIGN PATENT DOCUMENTS

KR  10-2014-0145263 A  12/2014
KR  10-2018-0031175 A   3/2018

OTHER PUBLICATIONS

International Search Report and Written Opinion dated Jun. 26, 2020 for International Application No. PCT/US2020/019725, 10 pages.

* cited by examiner

*Primary Examiner* — Moazzam Hossain
*Assistant Examiner* — Stanetta D Isaac
(74) *Attorney, Agent, or Firm* — Schwabe, Williamson & Wyatt, P.C.

(57) ABSTRACT

A dual mode snap back circuit device is disclosed. The dual mode snap back device may be used for electrostatic discharge (ESD) protection, and may provide both positive ESD protection and negative ESD protection. The dual mode snap back device may implement both an n-type metal-oxide-semiconductor (NMOS) transistor (e.g., a gate-grounded NMOS transistor, such as a gate-grounded extended drain NMOS (GGEDNMOS) transistor) to provide protection against positive ESD events and a bipolar junction transistor (BJT) (e.g., a PNP BJT) to provide protection against negative ESD events. Other embodiments may be described and claimed.

21 Claims, 6 Drawing Sheets

DUAL MODE SNAP BACK CIRCUIT DEVICE

TECHNICAL FIELD

Embodiments of the disclosure pertain to integrated circuits and, in particular, to a dual mode snap back circuit device for integrated circuits.

BACKGROUND

Electrostatic discharge (ESD) protection devices protect a circuit, such as a circuit coupled to an input/output (I/O) pad, from ESD events. On-chip ESD protection devices, such as ESD diodes, clamps, silicon-controlled rectifiers (SCRs), and other snapback and non-snapback devices have relatively large area footprints. Additionally, these devices introduce high parasitic capacitance and leakage current, which compromises performance for high-speed I/O design.

DESCRIPTION OF THE EMBODIMENTS

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Various embodiments herein may provide a dual mode snap back circuit device. The dual mode snap back device may be used for electrostatic discharge (ESD) protection, and may provide both positive ESD protection and negative ESD protection. The dual mode snap back device may implement both an n-type metal-oxide-semiconductor (NMOS) transistor (e.g., a gate-grounded NMOS transistor, such as a gate-grounded extended drain NMOS (GGEDNMOS) transistor) to provide protection against positive ESD events and a bipolar junction transistor (BJT) (e.g., a PNP BJT) to provide protection against negative ESD events. The dual mode snap back device may implement the NMOS transistor and BJT in less area (e.g., about 50% less layout area) than prior circuit designs that include separate NMOS transistors and BJTs. Additionally, the dual mode snap back device may exhibit lower parasitic capacitance and/or lower leakage current than prior designs.

Figure 1A:
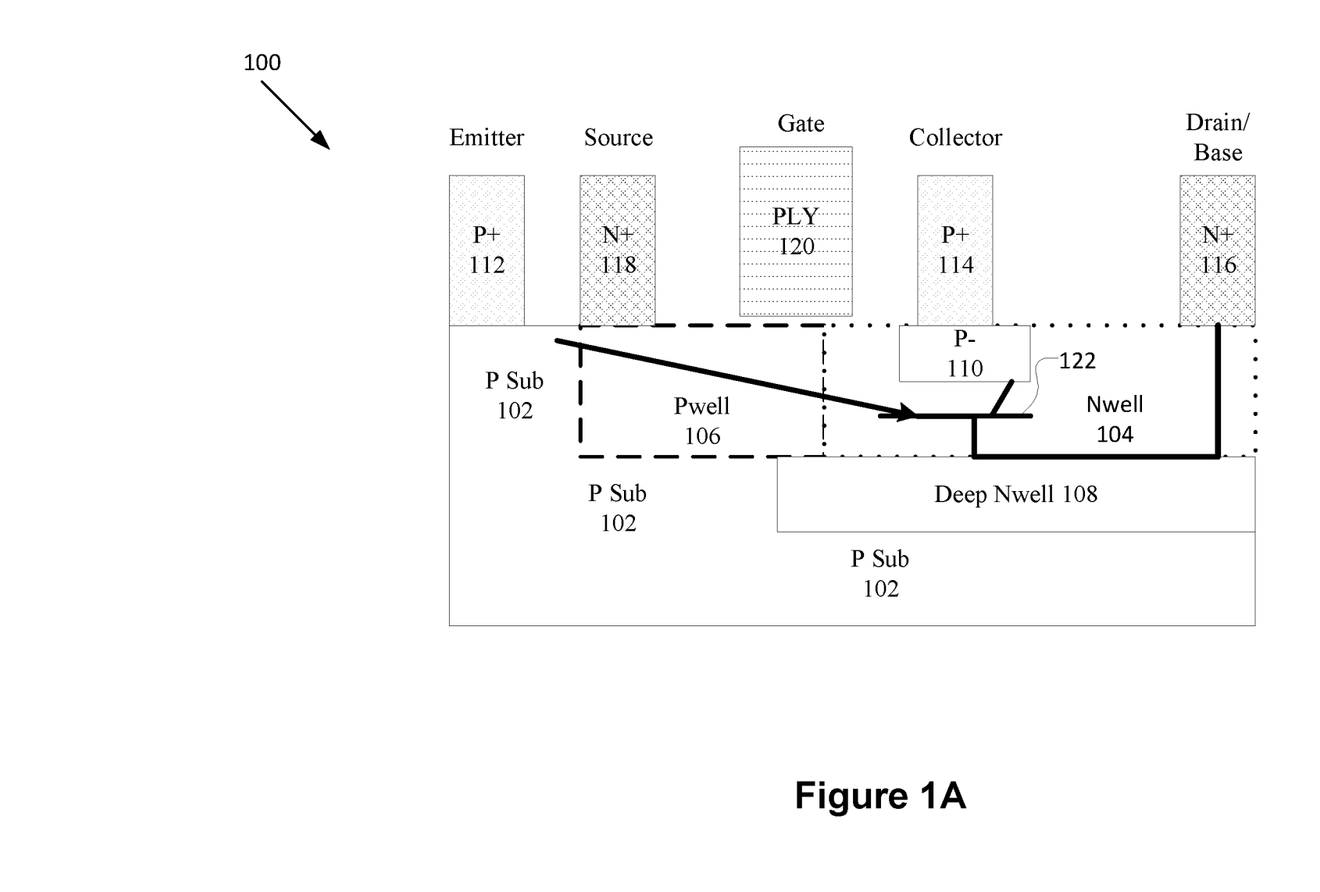
FIG. 1A is a cross-sectional side view of a dual mode snap back device according to an embodiment.

FIG. 1A illustrates a cross-sectional side view of a dual mode snap back device 100 (hereinafter "device 100"), in accordance with various embodiments. The device 100 may implement both an NMOS transistor (e.g., a GGEDNMOS) to provide protection against positive ESD events and a BJT (e.g., a PNP BJT) to provide protection against negative ESD events. The device 100 may implement the NMOS transistor and BJT in less area (e.g., 50% less layout area) than prior circuit designs that include separate NMOS transistors and BJTs. Additionally, the device 100 may exhibit lower parasitic capacitance and/or lower leakage current than prior designs.

The device 100 may be formed on a substrate 102, which may be a semiconductor, such as silicon or another suitable semiconductor as discussed elsewhere herein. In some embodiments, the substrate 102 may include a semiconductor fin. In other embodiments, the device 100 may be a planar circuit device (e.g., rather than fin-based). In some embodiments, the substrate 102 may be a p-type substrate. For example, the semiconductor of the substrate 102 may be doped with one or more dopants to be p-type.

In various embodiments, an N-well region 104 may be formed in the substrate 102. The N-well region 104 may be an n-type region. For example, the N-well region 104 may include the semiconductor material doped with one or more dopants to be n-type.

In various embodiments, a P-well region 106 may be formed in the substrate 102 adjacent to the N-well region 104. The P-well region 106 may be p-type, such as more p-type than the substrate 102.

In some embodiments, the device 100 may further include a deep N-well region 108 in the substrate 102 below the N-well region 104. In some embodiments, the deep N-well region 108 may also be at least partially below (e.g., in contact with) the P-well region 106, as shown in FIG. 1A. The deep N-well region 104 may have a different doping level and/or include different dopants than the N-well region. The deep N-well region 104 may enable the device 100 to handle higher voltage, which may be needed to effectively operate as an ESD protection device.

In various embodiments, the device 100 may further include a p-type region 110 in the N-well region 104. The p-type region 110 may lightly doped (e.g., P−, which is more lightly doped than regions referred to as P+). The p-type region 110 may extend only partially into the N-well region 104, so that the N-well region 104 is below the p-type region 110 (e.g., below and in contact with the p-type region 110). The N-well region 104 may further be disposed adjacent to the p-type region 110 on at least two sides of the p-type region 110, as shown in FIG. 1A.

In various embodiments, the device 100 may further include a p-type region 112 on the substrate 102 (e.g., on a portion of the substrate 102 adjacent to the P-well region 106). The p-type region 112 may form the emitter of the PNP BJT implemented by the device 100.

Another p-type region 114 may be on (e.g., on and in contact with) the p-type region 110 and may form the collector of the PNP BJT. The p-type regions 112 and/or 114 may be more highly doped than the p-type region 110 (e.g., the p-type regions 112 and/or 114 may be P+ regions).

An n-type region 116 may be on (e.g., on and in contact with) the N-well region 104, such as on a portion of the N-well region 104 that is adjacent the p-type region 110. The n-type region 116 may form the base of the PNP BJT implemented by the device 100. Additionally, the n-type region 116 may also form the drain of the NMOS transistor (e.g., GGEDNMOS) implemented by the device 100.

Another n-type region 118 may be on (e.g., on and in contact with) the P-well region 106. The n-type region 118 may form the source of the NMOS transistor implemented by the device 100. A gate region 120 may be over (e.g., on and in contact with) the P-well region 106 and the N-well region 104 (e.g., between the n-type region 118 and the n-type region 116 (and the p-type region 114)). The gate region 120 may include polysilicon and/or one or more other suitable materials. In some embodiments, the gate region 120 may further include a gate dielectric on the P-well region 106 and/or N-well region 104.

Accordingly, the device 100 may implement a PNP BJT, with the p-type region 112 as the emitter, the p-type region 114 as the collector, and the n-type region 116 as the drain. A BJT symbol 122 is shown in FIG. 1A for illustrative purposes. The device 100 may further implement an NMOS transistor (e.g., GGEDNMOS), with the n-type region 118 as the source, the gate region 120 as the gate, and the n-type region 116 as the drain.

To operate as an ESD protection device, the device 100 may have the n-type region 116 (drain NMOS transistor and base of BJT), and the p-type region 114 (collector of BJT) coupled to the signal pad to be protected. The p-type region 112 (emitter of the BJT), n-type region 118 (source of NMOS transistor), and gate region 120 (gate of NMOS transistor) may be coupled to a ground terminal that is to be coupled with a ground potential.

Figure 2:
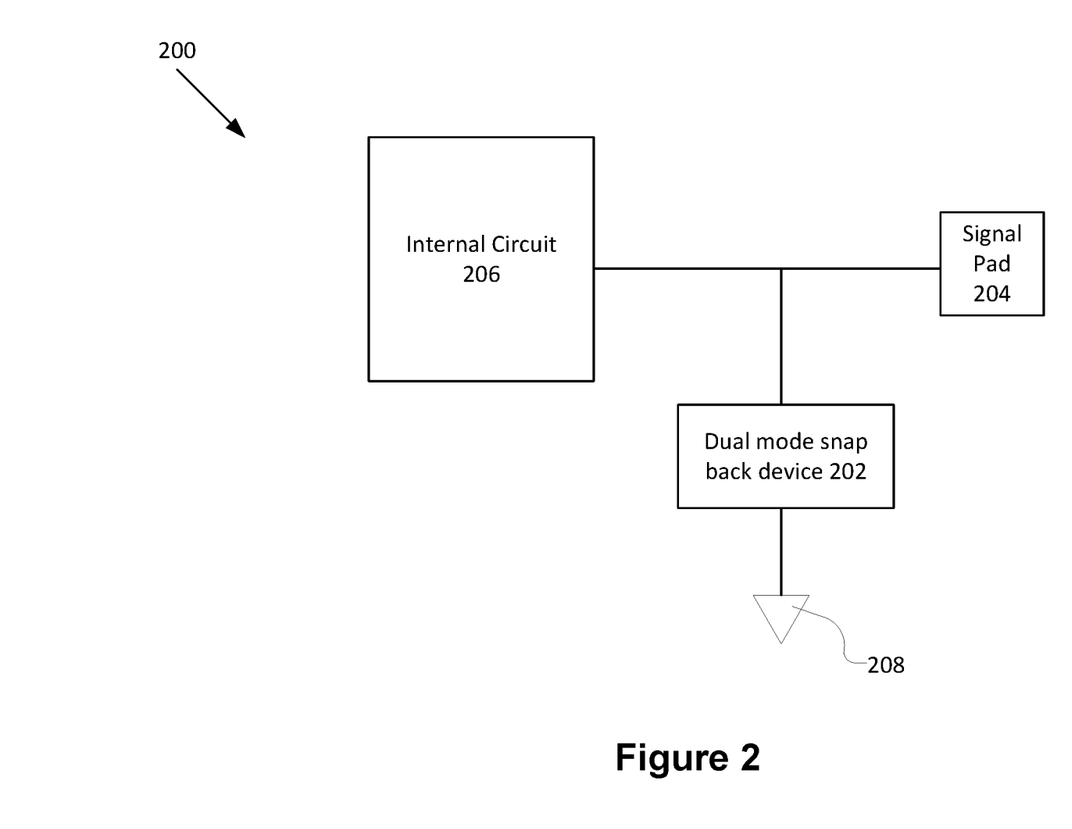
FIG. 2 schematically illustrates a circuit that includes a dual mode snap back device according to an embodiment.

For example, FIG. 2 illustrates a circuit 200 with a dual mode snap back device 202 coupled to a signal pad 204 (e.g., coupled to a node between the signal pad 204 and an internal circuit 206 that is to be protected from ESD stress). The dual mode snap back device 202 may correspond to the device 100 of FIG. 1A. As discussed above, the collector and the combined drain/base of the device 202 may be coupled to the signal pad 204, and the emitter, source, and gate may be coupled to a ground terminal 208 that is to be coupled with a ground potential.

When a positive ESD stress occurs at the signal pad 204 (e.g., a positive voltage/charge greater than a first threshold), the n-type region 116 and p-type region 114 are stressed, and the GGEDNMOS goes into snapback mode, thereby sinking (e.g., sending to ground) positive current coming through the n-type region 116 (drain) and p-type region 114 (collector).

When a negative ESD stress occurs at the signal pad 204 (e.g., a negative charge less than a second threshold), the n-type region 116 and p-type region 114 are stressed and the junction between the N-well 104 and substrate 102 of the GGEDNMOS is forward biased to sink ESD current. Additionally, the PNP BJT goes into snapback mode as the collector (p-type region 114) and base (n-type region 116) go to the same negative potential and the emitter (p-type region 112) is grounded. In snap back mode, the PNP BJT sinks ESD current.

In some embodiments, the p-type region 112, p-type region 114, n-type region 116, n-type region 118, and/or gate region 120 may include any suitable number of material layers, such as one or more material layers.

Figure 1B:
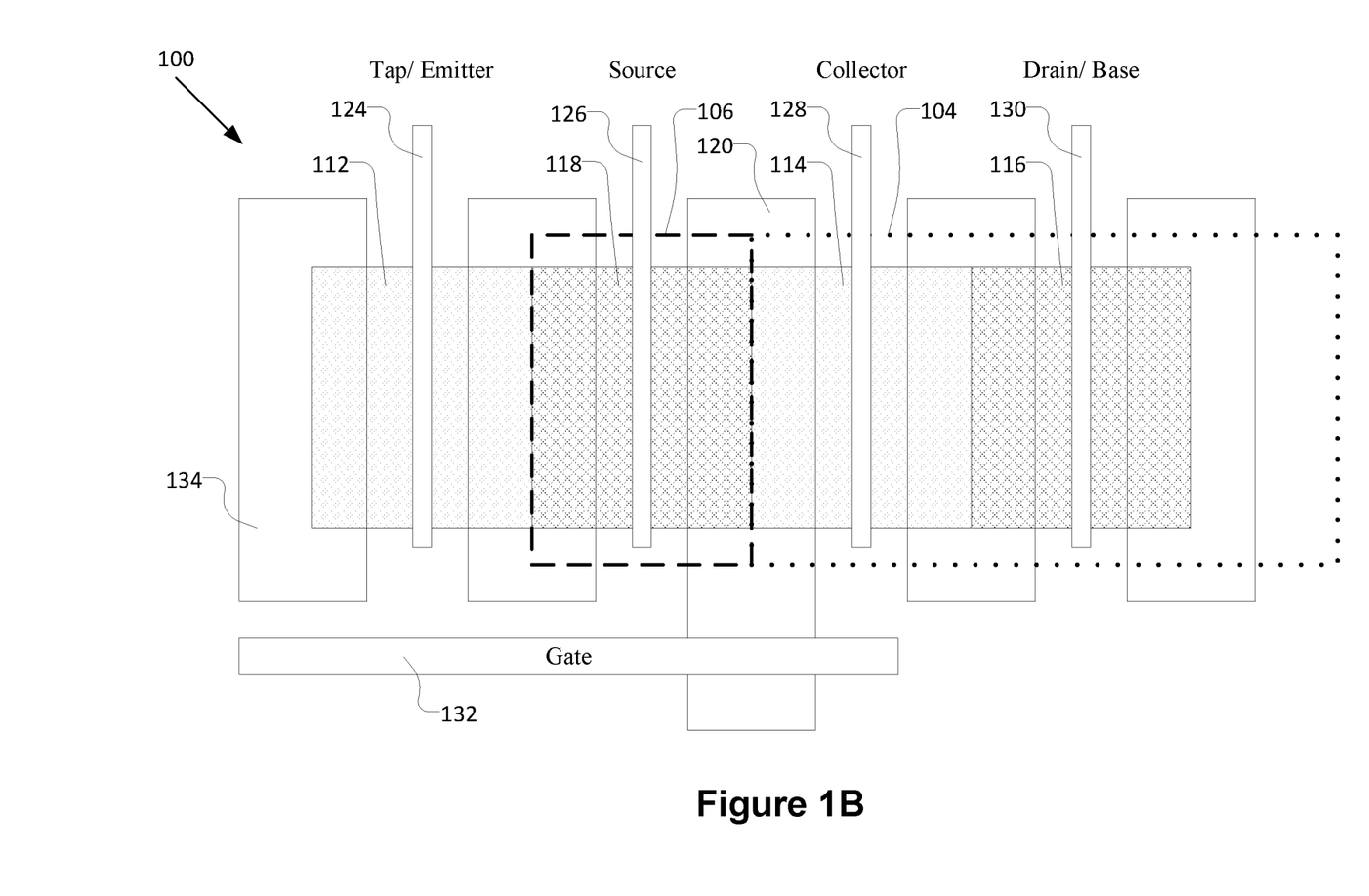
FIG. 1B is a top view of a dual mode snap back device according to an embodiment.

FIG. 1B illustrates a top view of the device 100, in accordance with some embodiments. FIG. 1B further illustrates an emitter contact 124 coupled to the p-type region 112. The emitter contact 124 may also be a tap to provide a conductive connection to the body region of the NMOS transistor. FIG. 1B further illustrates a source contact 126 coupled to the n-type region 118, a collector contact 128 coupled to the p-type region 114, a contact 130 coupled to the n-type region 116 (e.g., as a combined contact for the drain of the NMOS transistor and the base of the BJT), and a gate contact 132 coupled to the gate region 120. The contacts 124, 126, 128, 130, and 132 may facilitate electrical contact with the respective region of the device 100, and may each include one or more conductors, such as copper, indium, titanium, cobalt, magnesium, zinc, nickel, tantalum, gold, silver, ruthenium, palladium, tungsten, and/or another suitable conductor.

FIG. 1B further illustrates dummy gate regions 134, which may be present but not used in the device 100.

Figure 3:
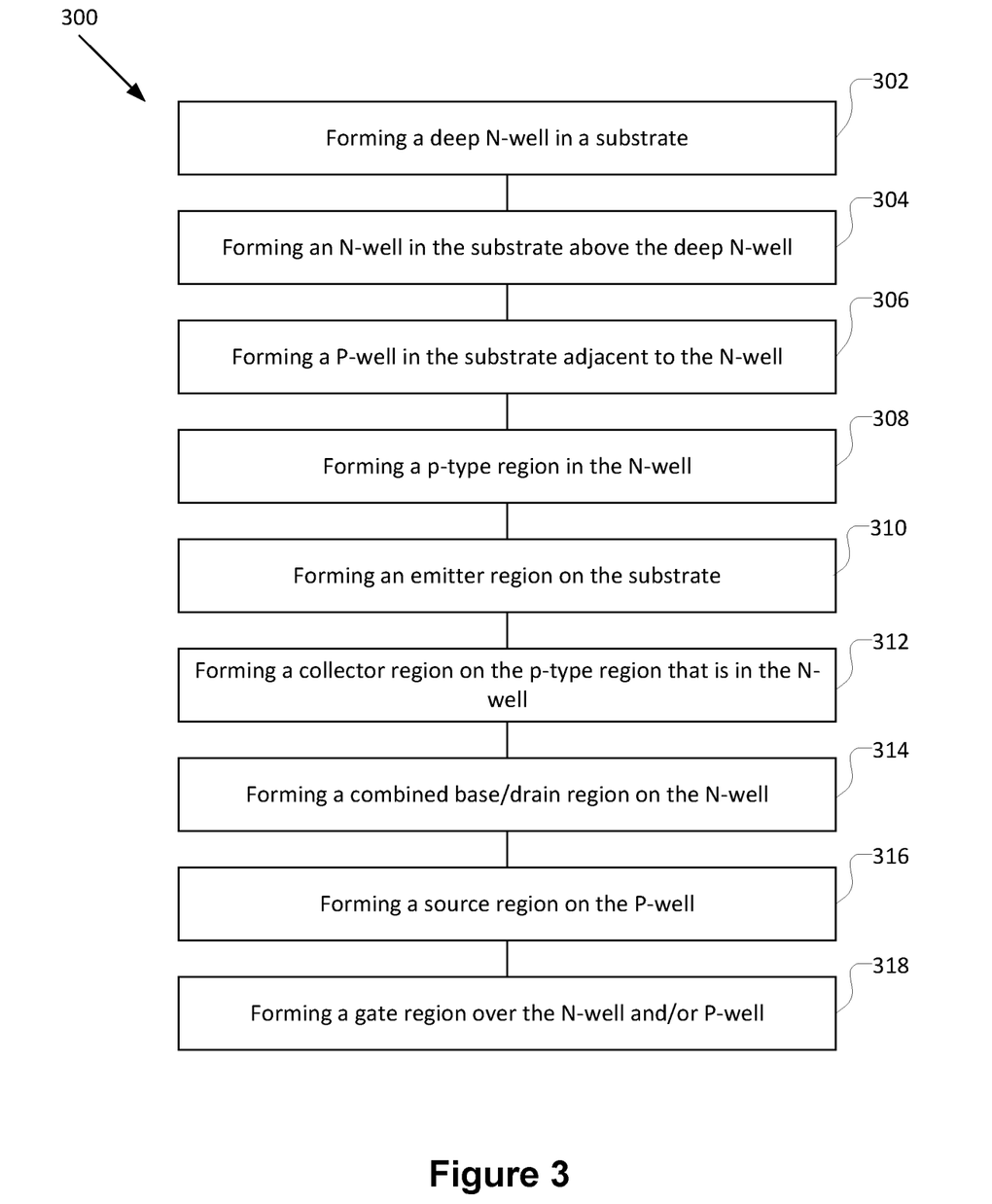
FIG. 3 is a flowchart of a process for forming a dual mode snap back device according to an embodiment.

FIG. 3 illustrates a method 300 of forming a dual mode snap back device (e.g., the dual mode snap back device 100), in accordance with various embodiments. The dual mode snap back device may implement a PNP BJT and a NMOS transistor (e.g., a GGEDNMOS transistor).

At 302, the method 300 may include forming a deep N-well (e.g., deep N-well 108) in a substrate (e.g., substrate 102). In some embodiments, the substrate may be a p-type substrate. At 304, the method 300 may include forming an N-well (e.g., N-well 104) in the substrate above the deep N-well. At 306, the method 300 may include forming a P-well (e.g., P-well 106) in the substrate adjacent to the N-well. At 308, the method 300 may include forming a p-type region (e.g., p-type region 110) in the N-well.

At 310, the method 300 may include forming an emitter region on the substrate. The emitter region may be the emitter of the PNP BJT. The emitter region may include a p-type doped semiconductor (e.g., may correspond to p-type region 112). At 312, the method 300 may include forming a collector region on the p-type region that is in the N-well. The collector region may be the collector of the PNP BJT. The collector region may include a p-type doped semiconductor (e.g., may correspond to p-type region 114). The collector region may have similar dopants and/or doping concentration to the emitter region, or different dopants and/or doping concentration, as appropriate. In some embodiments, the collector region may be more highly doped and/or include different dopants than the p-type region below it.

At 314, the method 300 may include forming a combined base/drain region on the N-well. The combined base/drain region may be the base of the PNP BJT and the drain of the NMOS transistor. The base/drain region may include an n-type doped semiconductor (e.g., may correspond to n-type region 116). The collector region may be between the base/drain region and the emitter region.

At 316, the method 300 may include forming source region on the P-well. The source region may be the source of the NMOS transistor. The source region may include an n-type doped semiconductor (e.g., may correspond to n-type region 118). The source region may be between the emitter region and the collector region.

At 318, the method 300 may include forming a gate region over the N-well and/or P-well (e.g., over both the N-well and the P-well). The gate region may be the gate of the NMOS transistor. The gate region may be between the second p-type region and the second n-type region. In some embodiments, the gate region may include polysilicon and/or other suitable semiconductor material. The gate region may be undoped or doped substantially neutrally in some embodiments. In some embodiments, the method 300 may further include forming a gate dielectric on the N-well and/or P-well, and forming the gate region on the gate dielectric.

In some embodiments, the method 300 may further include one or more additional processing steps, such as forming respective conductive contacts coupled to the emitter, source, gate, collector, and/or combined base/drain regions. Additionally, or alternatively, the method 300 may include conductively coupling the emitter, source, and gate regions to a ground terminal that is to be coupled with a ground potential, and conductively coupling the collector and combined base/drain regions with a circuit node (e.g., signal pad) that is to be protected from ESD stress.

Implementations of embodiments described herein may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

One or more dual mode snap back devices, as described herein, may be fabricated on the substrate. In various implementations, the dual mode snap back devices may be planar devices (e.g., formed on a planar substrate), nonplanar devices (e.g., formed on a nonplanar substrate, such as a fin), or a combination of both. Nonplanar devices may include FinFET transistors such as double-gate transistors and tri-gate transistors, and wrap-around or all-around gate transistors such as nanoribbon and nanowire transistors.

In some implementations, the gate region of the dual mode snap back device may include a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may be a planar layer that is substantially parallel to the top surface of the substrate and does not include sidewall portions substantially perpendicular to the top surface of the substrate. In further implementations, the gate electrode may consist of a combination of U-shaped structures and planar, non-U-shaped structures. For example, the gate electrode may consist of one or more U-shaped metal layers formed atop one or more planar, non-U-shaped layers.

In some implementations, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

In some implementations, the source, drain/base, emitter, and/or collector regions may be formed using either an implantation/diffusion process or an etching/deposition process. In the former process, dopants such as boron, aluminum, antimony, phosphorous, or arsenic may be ion-implanted into the substrate to form the source, drain/base, emitter, and/or collector regions. An annealing process that activates the dopants and causes them to diffuse further into the substrate may follow the ion implantation process. In the latter process, the substrate may first be etched to form recesses at the locations of the source, drain/base, emitter, and/or collector regions. An epitaxial deposition process may then be carried out to fill the recesses with material that is used to fabricate the source, drain/base, emitter, and/or collector regions. Such a process may also be used to form the regions on top of the substrate without etching into the substrate. In some implementations, the source, drain/base, emitter, and/or collector regions may be fabricated using a silicon alloy such as silicon germanium or silicon carbide. In some implementations the epitaxially deposited silicon alloy may be doped in situ with dopants such as boron, arsenic, or phosphorous. In further embodiments, the source, drain/base, emitter, and/or collector regions may be formed using one or more alternate semiconductor materials such as germanium or a group III-V material or alloy. And in further embodiments, one or more layers of metal and/or metal alloys may be used to form the source and drain regions.

One or more interlayer dielectric (ILD) layers may be deposited over the dual mode snap back device. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 4:
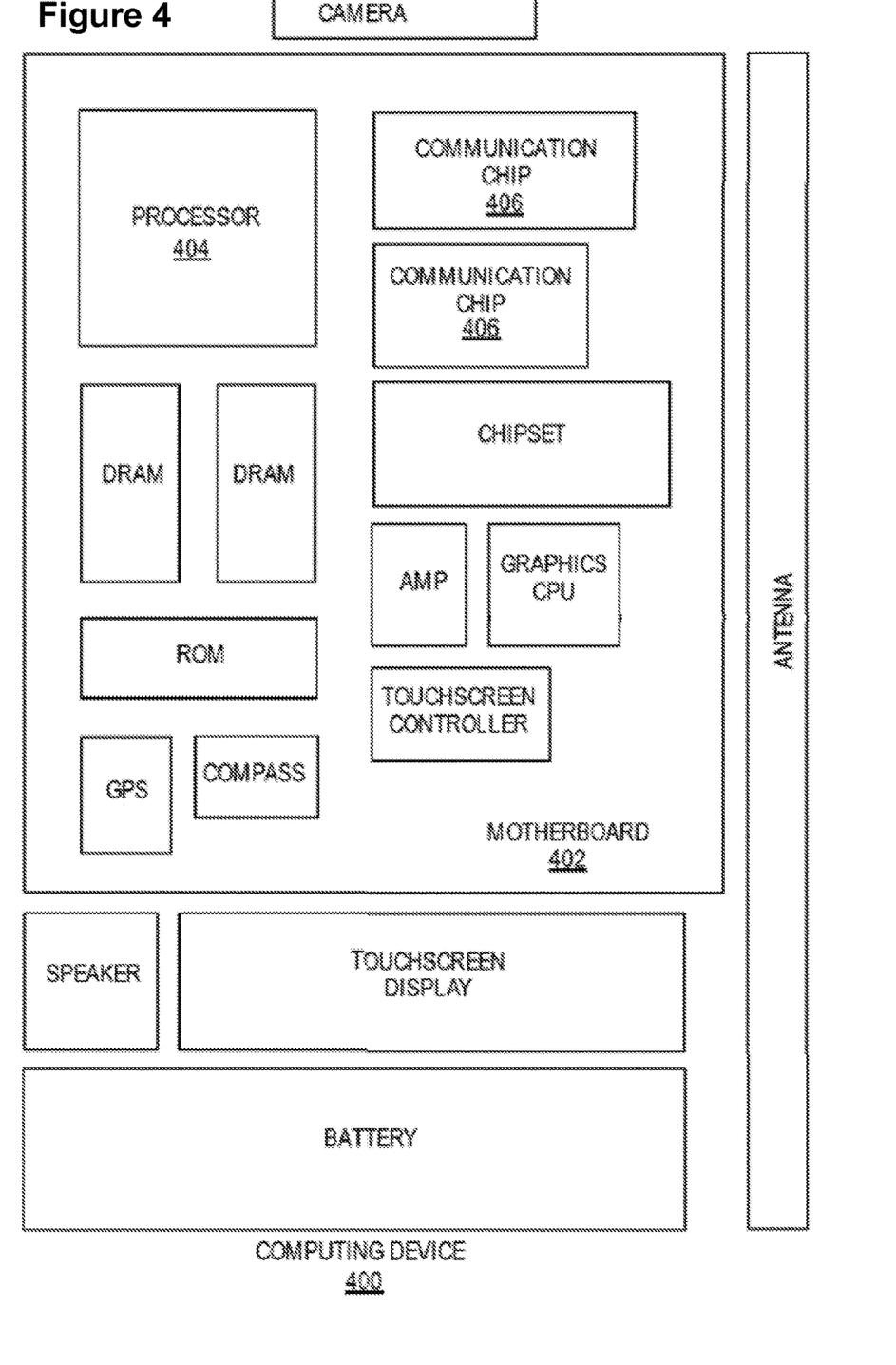
FIG. 4 illustrates a computing device that may include one or more dual mode snap back devices in accordance with one implementation of an embodiment.

FIG. 4 illustrates a computing device 400 in accordance with one example implementation. The computing device 400 houses a board 402 (e.g., motherboard). The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3 G, 4 G, 5 G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations, the integrated circuit die of the processor includes one or more dual mode snap back devices, in accordance with various embodiments described herein. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation, the integrated circuit die of the communication chip includes one or more dual mode snap back devices, in accordance with various embodiments described herein.

In further implementations, another component housed within the computing device 400 may contain an integrated circuit die that includes one or more dual mode snap back devices, in accordance with various embodiments described herein.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
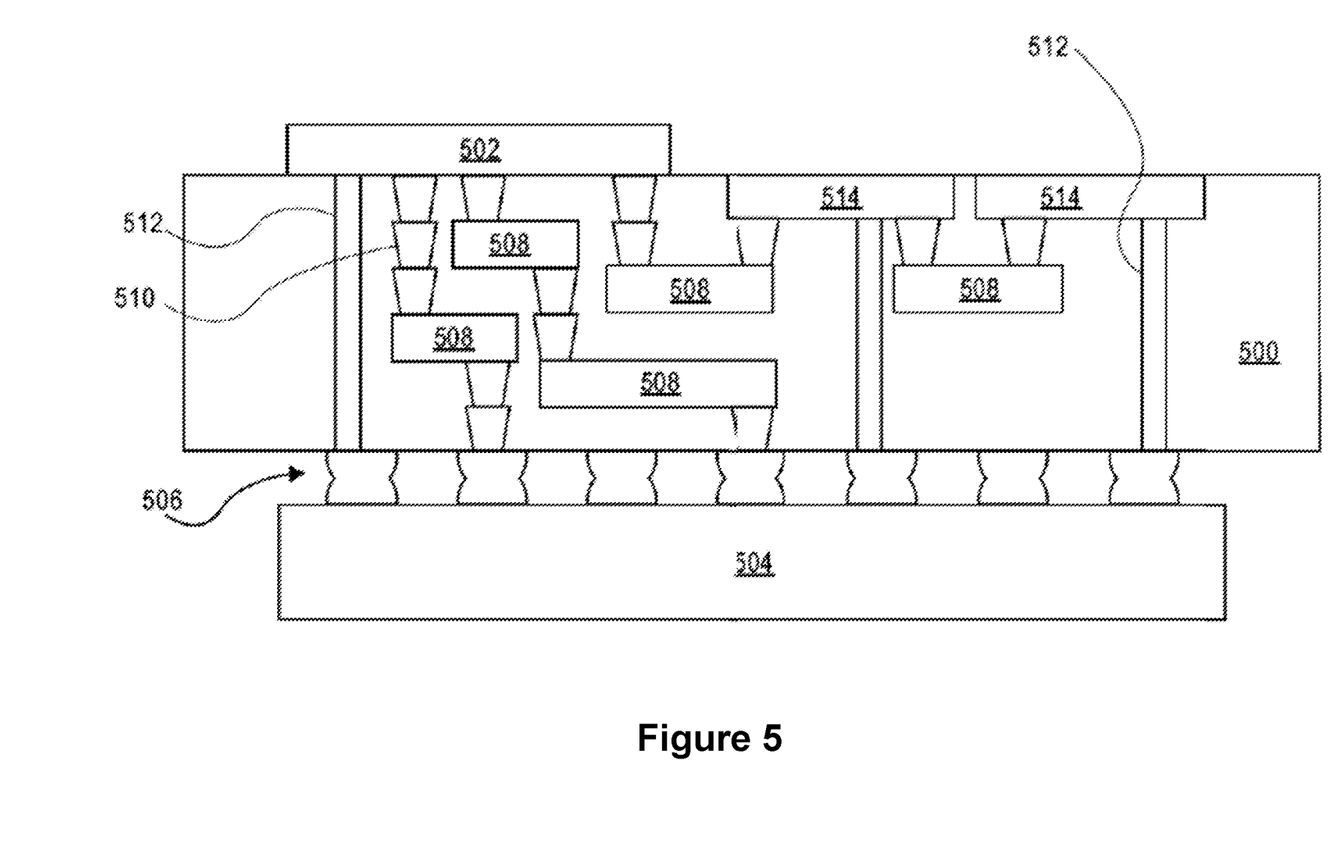
FIG. 5 illustrates an interposer that includes one or more examples of an embodiment.

FIG. 5 illustrates an interposer 500 that includes one or more embodiments described herein. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and ESD devices. In some embodiments, one or more of the ESD devices may correspond to the dual mode snap back device described herein. More complex devices such as radio-frequency (RF) devices, power amplifiers, power management devices, antennas, arrays, sensors, and MEMS devices may also be formed on the interposer 500. In accordance with various embodiments, apparatuses or processes disclosed herein may be used in the fabrication of interposer 500.

The following examples pertain to further embodiments. The various features of the different embodiments may be variously combined with some features included and others excluded to suit a variety of different applications.

Example 1 is a circuit comprising: a signal pad; and a dual mode snap back device coupled to the signal pad, the dual mode snap back device to implement a PNP bipolar junction transistor (BJT) and an n-type metal-oxide-semiconductor (NMOS) transistor. The dual mode snap back device includes: a first p-type region on a substrate, wherein the first p-type region is an emitter of the PNP BJT; a first n-type region on an N-well, wherein the first n-type region is the base of the PNP BJT and the drain of the NMOS transistor; a second n-type region on a P-well, wherein the second n-type region is the source of the NMOS transistor; and a second p-type region between the first and second n-type regions, wherein the second p-type region is the collector of the PNP BJT; wherein the first n-type region and the second p-type region are conductively coupled to the signal pad; and wherein the first p-type region and the second n-type region are conductively coupled to a ground terminal.

Example 2 is the circuit of Example 1, further comprising a gate region over the N-well and the P-well, wherein the gate region is the gate of the NMOS, and wherein the gate region is conductively coupled to the ground terminal.

Example 3 is the circuit of Example 1, wherein the second p-type region is on a third p-type region that is in the N-well, wherein the third p-type region is more lightly doped than the second p-type region.

Example 4 is the circuit of Example 1, wherein the dual mode snap back device further comprises a deep N-well below the N-well, wherein the deep N-well is doped differently than the N-well.

Example 5 is the circuit of Example 1, wherein the substrate is a p-type substrate.

Example 6 is the circuit of Example 1, wherein the P-well is adjacent to the N-well, and wherein the first p-type region is on a portion of the substrate that is adjacent to the P-well.

Example 7 is the circuit of Example 1, wherein the NMOS transistor is a gate-grounded extended drain NMOS (GGEDNMOS) transistor.

Example 8 is the circuit of Example 1, wherein the NMOS transistor is to enter a snapback mode in response to a positive ESD stress on the signal pad, and wherein the PNP BJT is to enter a snapback mode in response to a negative ESD stress on the signal pad.

Example 9 is a dual mode snap back circuit device comprising: a first p-type region on a substrate, wherein the first p-type region is an emitter of a PNP BJT; a first n-type region on an N-well, wherein the first n-type region is the base of the PNP BJT and the drain of a gate-grounded extended drain n-type metal-oxide-semiconductor (GGEDNMOS) transistor; a second n-type region on a P-well, wherein the second n-type region is the source of the GGEDNMOS transistor; a second p-type region between the first and second n-type regions, wherein the second p-type region is the collector of the PNP BJT, wherein the second p-type region is on a third p-type region that is in the N-well, and wherein the third p-type region is more lightly doped than the second p-type region; and a gate region between the second n-type region and the second p-type region, wherein the gate region is the gate of the GGEDNMOS transistor.

Example 10 is the device of Example 9, wherein the first n-type region and the second p-type region are conductively coupled to a node that is to be protected from ESD stress; and wherein the first p-type region, the second n-type region, and the gate region are conductively coupled to a ground terminal.

Example 11 is the device of Example 10, wherein the GGEDNMOS transistor is to enter a snapback mode in response to a positive ESD stress on the node, and wherein the PNP BJT is to enter a snapback mode in response to a negative ESD stress on the node.

Example 12 is the device of Example 9, wherein the gate region is over the N-well and the P-well.

Example 13 is the device of Example 9, further comprising a deep N-well below the N-well, wherein the deep N-well is doped differently than the N-well.

Example 14 is the device of Example 9, wherein the substrate is a p-type substrate.

Example 15 is the device of Example 9, wherein the P-well is adjacent to the N-well, and wherein the first p-type region is on a portion of the substrate that is adjacent to the P-well.

Example 16 is a computing system comprising: a motherboard; and an integrated circuit (IC) die coupled to the motherboard. The IC die includes: an input/output (I/O) pad; and a dual mode snap back device coupled to the signal pad, the dual mode snap back device to implement a PNP bipolar junction transistor (BJT) and an n-type metal-oxide-semiconductor (NMOS) transistor. The dual mode snap back device includes: a first p-type region that is an emitter of the PNP BJT; a first n-type region that is the base of the PNP BJT and the drain of the NMOS transistor; a second n-type region between the first p-type region and the first n-type region, wherein the second n-type region is the source of the NMOS transistor; a second p-type region between the first and second n-type regions, wherein the second p-type region is the collector of the PNP BJT; and a gate region between the second n-type region and the second p-type region, wherein the gate region is the gate of the NMOS transistor; wherein the first n-type region and the second p-type region are conductively coupled to the I/O pad; and wherein the first p-type region, the second n-type region, and the gate region are conductively coupled to a ground terminal.

Example 17 is the computing system of Example 16, wherein: the first p-type region is on a p-type substrate; the first n-type region is on an N-well; the second n-type region is on a P-well; the second p-type region is on a third p-type region, wherein the third p-type region is in the N-well and is more lightly doped than the second p-type region; and the gate region is over the P-well and the N-well.

Example 18 is the computing system of Example 16, wherein the dual mode snap back device further comprises a deep N-well below the N-well, wherein the deep N-well is doped differently than the N-well.

Example 19 is the computing system of Example 16, wherein the NMOS transistor is a gate-grounded extended drain NMOS (GGEDNMOS) transistor.

Example 20 is the computing system of Example 16, wherein the NMOS transistor is to enter a snapback mode in response to a positive ESD stress on the I/O pad, and wherein the PNP BJT is to enter a snapback mode in response to a negative ESD stress on the I/O pad.

Example 21 is the computing system of Example 16, further comprising one or more of a memory circuit, a communication chip, an antenna, or a display coupled to the IC die.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A circuit comprising:
   a signal pad; and
   a dual mode snap back device coupled to the signal pad, the dual mode snap back device to implement a PNP bipolar junction transistor (BJT) and an n-type metal-oxide-semiconductor (NMOS) transistor, wherein the dual mode snap back device includes:
      a first p-type region on a substrate, wherein the first p-type region is an emitter of the PNP BJT;
      a first n-type region on an N-well, wherein the first n-type region is a base of the PNP BJT and a drain of the NMOS transistor;
      a second n-type region on a P-well, wherein the second n-type region is a source of the NMOS transistor; and
      a second p-type region between the first and second n-type regions, wherein the second p-type region is a collector of the PNP BJT;
      wherein the first n-type region and the second p-type region are conductively coupled to the signal pad; and
      wherein the first p-type region and the second n-type region are conductively coupled to a ground terminal.

2. The circuit of claim 1, further comprising a gate region over the N-well and the P-well, wherein the gate region is a gate of the NMOS, and wherein the gate region is conductively coupled to the ground terminal.

3. The circuit of claim 1, wherein the second p-type region is on a third p-type region that is in the N-well, wherein the third p-type region is more lightly doped than the second p-type region.

4. The circuit of claim 1, wherein the dual mode snap back device further comprises a deep N-well below the N-well, wherein the deep N-well is doped differently than the N-well.

5. The circuit of claim 1, wherein the substrate is a p-type substrate.

6. The circuit of claim 1, wherein the P-well is adjacent to the N-well, and wherein the first p-type region is on a portion of the substrate that is adjacent to the P-well.

7. The circuit of claim 1, wherein the NMOS transistor is a gate-grounded extended drain NMOS (GGEDNMOS) transistor.

8. The circuit of claim 1, wherein the NMOS transistor is to enter a snapback mode in response to a positive electrostatic discharge (ESD) stress on the signal pad, and wherein the PNP BJT is to enter a snapback mode in response to a negative ESD stress on the signal pad.

9. A dual mode snap back circuit device comprising:
   a first p-type region on a substrate, wherein the first p-type region is an emitter of a PNP BJT;
   a first n-type region on an N-well, wherein the first n-type region is a base of the PNP BJT and a drain of a gate-grounded extended drain n-type metal-oxide-semiconductor (GGEDNMOS) transistor;
   a second n-type region on a P-well, wherein the second n-type region is a source of the GGEDNMOS transistor;
   a second p-type region between the first and second n-type regions, wherein the second p-type region is a collector of the PNP BJT, wherein the second p-type region is on a third p-type region that is in the N-well, and wherein the third p-type region is more lightly doped than the second p-type region; and
   a gate region between the second n-type region and the second p-type region, wherein the gate region is the gate of the GGEDNMOS transistor.

10. The device of claim 9,
    wherein the first n-type region and the second p-type region are conductively coupled to a node that is to be protected from ESD stress; and
    wherein the first p-type region, the second n-type region, and the gate region are conductively coupled to a ground terminal.

11. The device of claim 10, wherein the GGEDNMOS transistor is to enter a snapback mode in response to a positive ESD stress on the node, and wherein the PNP BJT is to enter a snapback mode in response to a negative ESD stress on the node.

12. The device of claim 9, wherein the gate region is over the N-well and the P-well.

13. The device of claim 9, further comprising a deep N-well below the N-well, wherein the deep N-well is doped differently than the N-well.

14. The device of claim 9, wherein the substrate is a p-type substrate.

15. The device of claim 9, wherein the P-well is adjacent to the N-well, and wherein the first p-type region is on a portion of the substrate that is adjacent to the P-well.

16. A computing system comprising:
a motherboard; and
an integrated circuit (IC) die coupled to the motherboard, the IC die including:
an input/output (I/O) pad; and
a dual mode snap back device coupled to a signal pad, the dual mode snap back device to implement a PNP bipolar junction transistor (BJT) and an n-type metal-oxide-semiconductor (NMOS) transistor, wherein the dual mode snap back device includes:
a first p-type region that is an emitter of the PNP BJT;
a first n-type region that is a base of the PNP BJT and a drain of the NMOS transistor;
a second n-type region between the first p-type region and the first n-type region, wherein the second n-type region is a source of the NMOS transistor;
a second p-type region between the first and second n-type regions, wherein the second p-type region is a collector of the PNP BJT; and
a gate region between the second n-type region and the second p-type region, wherein the gate region is a gate of the NMOS transistor;
wherein the first n-type region and the second p-type region are conductively coupled to the I/O pad; and
wherein the first p-type region, the second n-type region, and the gate region are conductively coupled to a ground terminal.

17. The computing system of claim 16, wherein:
the first p-type region is on a p-type substrate;
the first n-type region is on an N-well;
the second n-type region is on a P-well;
the second p-type region is on a third p-type region, wherein the third p-type region is in the N-well and is more lightly doped than the second p-type region; and
the gate region is over the P-well and the N-well.

18. The computing system of claim 17, wherein the dual mode snap back device further comprises a deep N-well below the N-well, wherein the deep N-well is doped differently than the N-well.

19. The computing system of claim 16, wherein the NMOS transistor is a gate-grounded extended drain NMOS (GGEDNMOS) transistor.

20. The computing system of claim 16, wherein the NMOS transistor is to enter a snapback mode in response to a positive ESD stress on the I/O pad, and wherein the PNP BJT is to enter a snapback mode in response to a negative ESD stress on the I/O pad.

21. The computing system of claim 16, further comprising one or more of a memory circuit, a communication chip, an antenna, or a display coupled to the IC die.

* * * * *